(12) United States Patent
Youn et al.

(10) Patent No.: US 11,110,801 B2
(45) Date of Patent: Sep. 7, 2021

(54) FAULT DIAGNOSIS SYSTEM OF POWER CONVERTER FOR ELECTRIC VEHICLE

(71) Applicants: HYUNDAI MOTOR COMPANY, Seoul (KR); KIA MOTORS CORPORATION, Seoul (KR)

(72) Inventors: Han Shin Youn, Seoul (KR); Ho Joong Lee, Anyang-Si (KR); Jee Heon Kim, Guri-Si (KR); Dong Jun Lee, Suwon-Si (KR); Hye Seung Kim, Gunpo-Si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 615 days.

(21) Appl. No.: 16/043,563

(22) Filed: Jul. 24, 2018

(65) Prior Publication Data
US 2019/0248242 A1    Aug. 15, 2019

(30) Foreign Application Priority Data
Feb. 9, 2018    (KR) .................. 10-2018-0016156

(51) Int. Cl.
*B60L 3/00* (2019.01)
*G01R 31/00* (2006.01)
*B60L 53/20* (2019.01)

(52) U.S. Cl.
CPC ............. *B60L 3/0061* (2013.01); *B60L 53/20* (2019.02); *G01R 31/007* (2013.01)

(58) Field of Classification Search
CPC .......... B60L 3/0061; B60L 53/20; Y02T 90/14
See application file for complete search history.

(56) References Cited

U.S. PATENT DOCUMENTS

2015/0301125 A1* 10/2015 Maekawa ............... H02M 7/06
324/764.01

FOREIGN PATENT DOCUMENTS

KR    2016-0081187 A    7/2016

* cited by examiner

*Primary Examiner* — Peter D Nolan
*Assistant Examiner* — Ce Li Li
(74) *Attorney, Agent, or Firm* — Morgan, Lewis & Bockius LLP

(57) ABSTRACT

A fault diagnosis system of a power converter for an electric vehicle includes a power supply supplied with power and converting the supplied power to provide the power to a motor, a battery, and an electronic device of a vehicle, a power supply supplied with power and converting the supplied power to provide the power to a motor, a battery, and an electronic device of a vehicle, a controller connected to the power supply by a connector and controlling charging and discharging of the battery, and operations of the motor and the electronic device of the vehicle by using the power provided from the power supply, and a fault diagnosis circuit connected between the power supply and the controller and diagnosing whether the connector which connects the power supply with the controller malfunctions.

4 Claims, 5 Drawing Sheets

FIG. 1 -PRIOR ART-
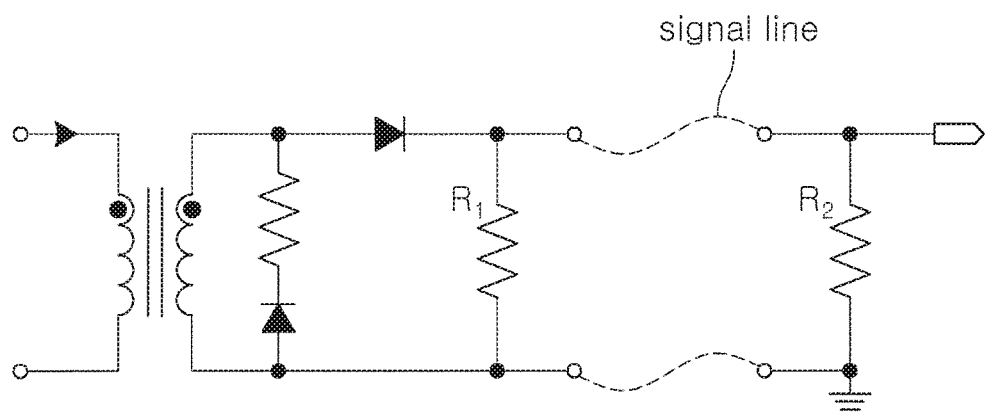
FIG. 2
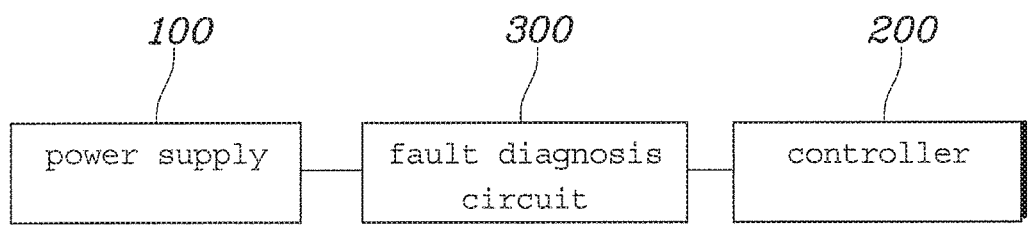

FAULT DIAGNOSIS SYSTEM OF POWER CONVERTER FOR ELECTRIC VEHICLE

CROSS REFERENCE TO RELATED APPLICATION

The present application claims the benefit of priority to Korean Patent Application No. 10-2018-0016156, filed Feb. 9, 2018, the entire contents of which is incorporated herein for all purposes by this reference.

TECHNICAL FIELD

The present disclosure relates generally to a fault diagnosis system of a power converter for an electric vehicle. More particularly, the present disclosure relates to a fault diagnosis system of a power converter for an electric vehicle, the system configured to quickly determine whether the power converter malfunctions.

BACKGROUND

Electric vehicles such as hybrid electric vehicles (HEVs), fuel cell vehicles, and fuel-cell hybrid vehicles are driven using a motor with an energy charged in a battery.

Conventionally, a high-capacity charging battery has been widely used in the electric vehicles such that electric vehicles are provided with an on-board charger (OBC) for charging the high-capacity charging battery. In addition, the electric vehicles are provided with a low voltage DC-DC converter (LDC), etc., the LDC configured to convert the high-capacity battery power in order to supply power to an auxiliary battery and an electronic load.

A vehicle power converter such as the OBC and the LDC is required for precise current control for charging and discharging a battery efficiently and conventionally the current control is performed through a current transformer (CT) current-sensing circuit included in the power converter.

However, as shown in FIG. 1, a fault such as a cut in signal line and contact failure may occur in the CT current sensing circuit of the related art due to vibration, etc. generated during drive of the vehicle. When such fault occurs, power converter is not controlled normally. Accordingly, overcurrent and overvoltage occurs in input and output for the power converter, and durability of the vehicle battery decreases as the battery is overcharged and over-discharged.

SUMMARY

The present disclosure has been made keeping in mind the above problems occurring in the related art. The present disclosure is intended to propose a fault diagnosis system of a power converter for an electric vehicle, wherein a fault diagnosis circuit in the power converter quickly determines whether the power converter malfunctions due to disconnection, contact failure, or the like.

According to one aspect of the present disclosure, a fault diagnosis system of a power converter for an electric vehicle includes: a power supply supplied with power and converting the supplied power to provide the power to a motor, a battery, and an electronic device of the vehicle; a controller connected to the power supply by a connector, and controlling charging and discharging of the battery and operations of the motor and the electronic device of the vehicle by using the power provided from the power supply; and a fault diagnosis circuit disposed between the power supply and the controller and diagnosing whether the connector, which connects the power supply with the controller, malfunctions.

The fault diagnosis circuit may include: a current transformer connected to the power supply and converting a current supplied from the power supply; a rectifier rectifying a current supplied from the current transformer; and a fault determination circuit connected to the rectifier by the connector and connected to the controller, and determining whether the connector which connects the power supply with the controller malfunctions.

The fault determination circuit may include: a reference voltage source supplying a reference voltage for determining a fault; and a comparator supplied with the reference voltage from the reference voltage source and an output voltage of the rectifier and comparing the voltages to each other, the fault determination circuit may determine whether the connector which connects the power supply with the controller malfunctions, according to an output value of the comparator.

A magnitude of the reference voltage may be determined in a range between a magnitude of a voltage output from an output terminal of the rectifier by the reference voltage source when the connector which connects the power supply with the controller is in a normal state and a magnitude of a voltage output from the output terminal of the rectifier by the reference voltage source when the connector which connects the power supply with the controller is in an abnormal state.

The fault determination circuit may determine that the connector malfunctions when the output value of the comparator converges to a predetermined value.

The fault determination circuit may determine that the connector is in a normal state when the output value of the comparator pulsates without converging to a predetermined value.

The rectifier may include a plurality of diodes and a plurality of resistors.

According to the present disclosure, it is possible to quickly identify whether a power converter malfunctions due to disconnection, contact failure, or the like.

In addition, it is possible to prevent overcurrent and overvoltage due to control error of the power converter when the power converter malfunctions due to a fault such as disconnection or contact failure occurring in the power converter.

Furthermore, it is possible to prevent overcharge and over-discharge of a vehicle battery, thereby improving durability of the battery.

BRIEF DESCRIPTION OF THE DRAWINGS

The above and other objects, features, and other advantages of the present disclosure will be more clearly understood from the following detailed description when taken in conjunction with the accompanying drawings, in which:

FIG. 1 is a detailed circuit diagram of a current sensing module using a current transformer (CT) in the related art;

FIG. 2 is a block diagram roughly showing an entire configuration of a fault diagnosis system of a power converter for an electric vehicle according to an embodiment of the present disclosure;

DETAILED DESCRIPTION

Hereinafter, a fault diagnosis system of a power converter for an electric vehicle according to exemplary embodiments of the present disclosure will be described in detail with reference to the accompanying drawings.

Figure 3:
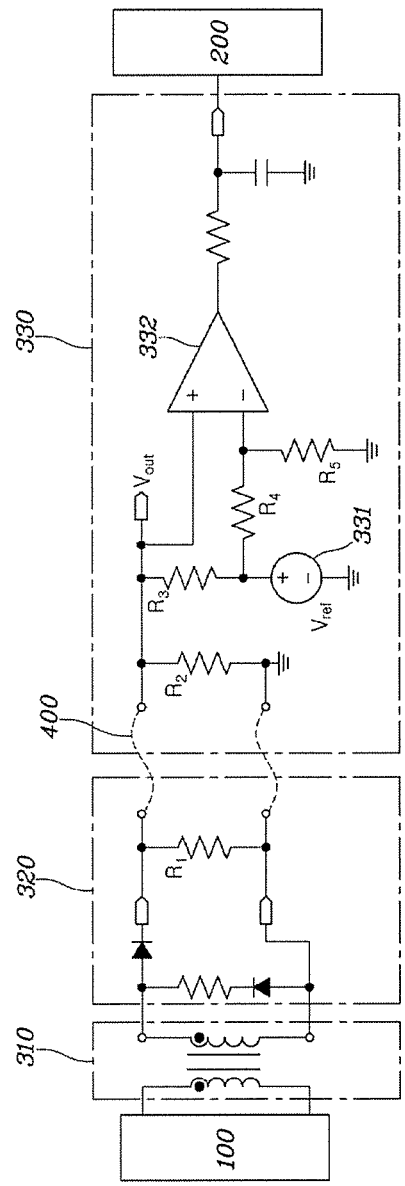
FIG. 3 is a detailed circuit diagram showing a fault diagnosis circuit in the fault diagnosis system of the power converter for the electric vehicle according to the embodiment of the present disclosure.
Figure 4:
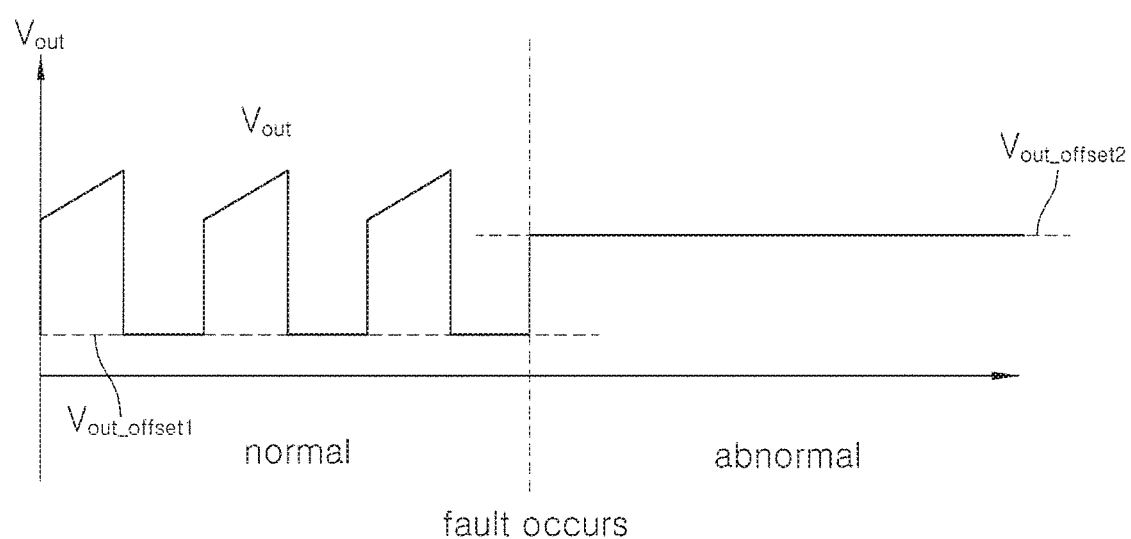
FIG. 4 is a view showing that an output voltage value of a rectifier in a fault diagnosis system of the power converter for the electric vehicle according to the embodiment of the present disclosure, when a connector is in normal and abnormal states.
Figure 5:
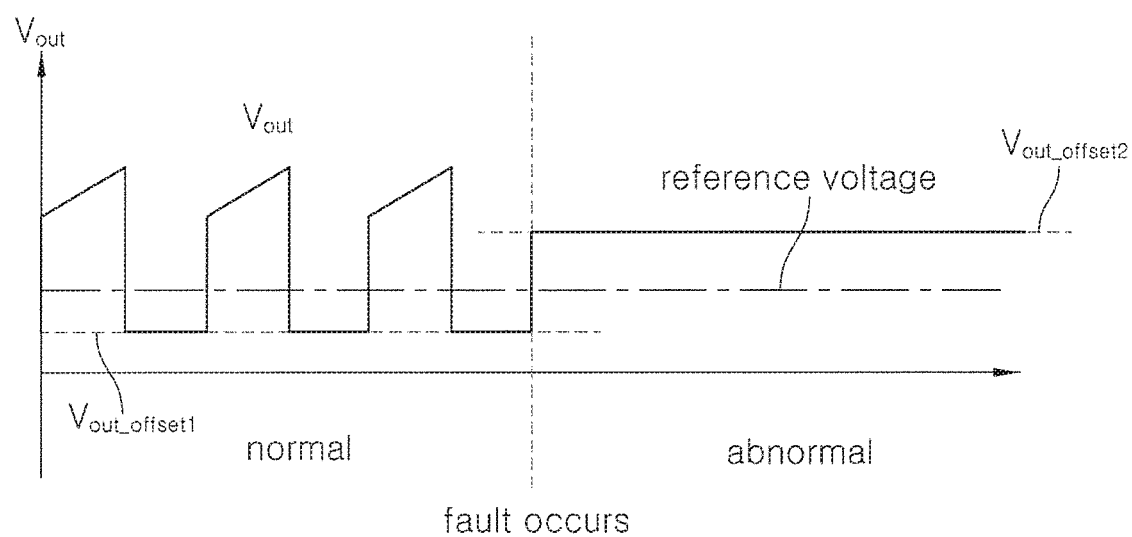
FIG. 5 is a view showing a magnitude of a reference voltage provided by a reference voltage source in the fault diagnosis system of the power converter for the electric vehicle according to the embodiment of the present disclosure.
Figure 6:
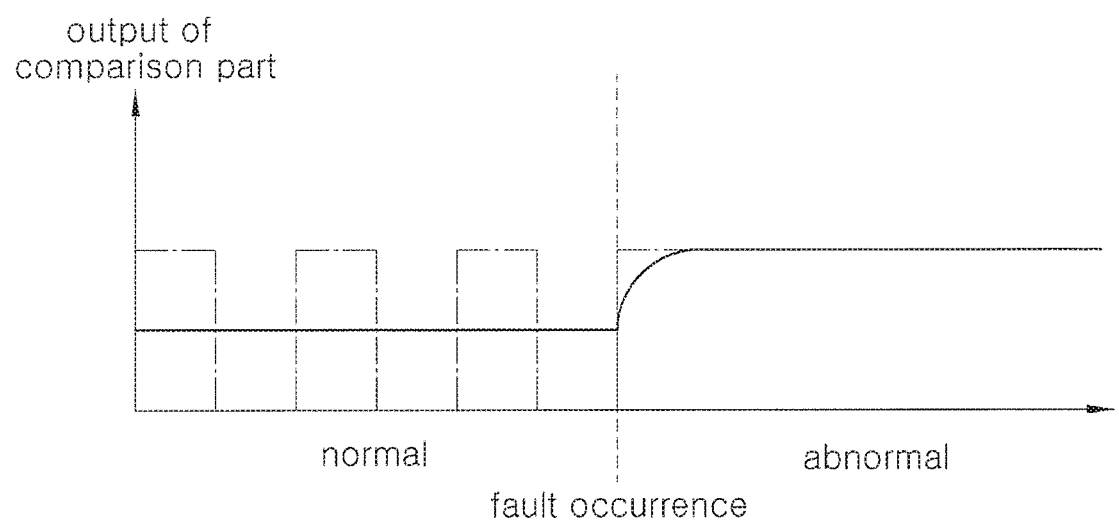
FIG. 6 is a view showing an output value of a comparator in the fault diagnosis system of the power converter for the electric vehicle according to the embodiment of the present disclosure, when the connector is in normal and abnormal states.

FIG. 2 is a block diagram roughly showing an entire configuration of the fault diagnosis system of the power converter for an electric vehicle according to an embodiment of the present disclosure. FIG. 3 is a detailed circuit diagram showing a fault diagnosis circuit. FIG. 4 is a view showing that an output voltage value of a rectifier when a connector is in normal and abnormal states. FIG. 5 is a view showing a magnitude of a reference voltage provided by a reference voltage source. FIG. 6 is a view showing an output value of a comparator when the connector is in normal and abnormal states.

As shown in FIG. 2, in the fault diagnosis system of the power converter for the electric vehicle according to the embodiment of the present disclosure, the power converter may include a power supply 100 and a controller 200 separately to perform a complicated control in the vehicle efficiently. A fault diagnosis circuit 300 may be connected between the power supply 100 and the controller 200, the fault diagnosis circuit 300 diagnosing whether a connector 400 connecting the power supply 100 with the controller 200 malfunctions or not. At this point, the power converter may be an on-board charger (OBC) charging a high voltage battery of an electric vehicle, a low voltage DC-DC converter (LDC) supplying power to an auxiliary battery and an electronic device for the vehicle, and so on, depending on embodiments.

In detail, the power supply 100 is supplied with power, and converts the supplied power to provide the power to a motor, a battery, and an electronic device of the vehicle. According to an embodiment, when the power converter is the OBC, the power supply 100 is supplied with power from outside, and then converts the supplied power to charge the high voltage battery or provides the charged power to drive the motor of the vehicle or to charge the auxiliary battery. In addition, when the power converter is the LDC according to another embodiment, the power supply 100 is supplied with power from the high voltage battery, and then converts the supplied power to charge the auxiliary battery or provides a required power for driving the electronic device of the vehicle.

The controller 200 is connected to the power supply 100 by the connector 400, and controls charging and discharging of the battery and operations of the motor and the electronic device of the vehicle by using the power provided from the power supply 100. According to an embodiment, when the power converter is the OBC, the controller 200 is supplied with power from the high voltage battery, which is supplied with power from outside, and controls the driving of the motor of the vehicle. In addition, when the power converter is the LDC according to another embodiment, the controller 200 controls the charging and discharging of the auxiliary battery or driving of the electronic device of the vehicle.

The fault diagnosis circuit 300 is connected between the power supply 100 and the controller 200, and diagnoses whether the connector 400 connecting the power supply 100 with the controller 200 malfunctions. Here, the connector 400 may be a signal line.

In various embodiments of the present disclosure, the power supply 100 is an electrical device capable of supplying electric power to an electrical load, and the controller 200 is a hardware device, such as an electronic control unit (ECU), capable of controlling one or more of the electrical systems in a vehicle.

Hereinbelow, the fault diagnosis circuit 300 will be described in detail with reference to FIG. 3.

As shown in FIG. 3, the fault diagnosis circuit 300 may include a current transformer 310, a rectifier 320, and a fault determination circuit 330.

The current transformer 310 is connected to the power supply 100, and converts a current supplied from the power supply 100. The current transformer 310 may be a current transformer (CT) in the present disclosure.

The rectifier 320 rectifies a current supplied from the current transformer 310. As shown in FIG. 3, the rectifier 320 may include a plurality of diodes and a plurality of resistors. In detail, a diode D1 is connected between the current transformer 310 and a resistor R0 to be forward-biased in the rectifier 320. The resistor R0 and the diode D1 are connected in series with each other. In addition, a diode D2 is connected in series between the current transformer 310 and a resistor R1, and the resistor R0 and the resistor R1 are connected in parallel with each other.

The fault determination circuit 330 is connected to the rectifier 320 by the connector 400 and connected to the controller 200, and determines whether the connector 400 connecting the power supply 100 with the controller 200 malfunctions.

In detail, as shown in FIG. 3, the fault determination circuit 330 includes a reference voltage source 331 supplying a reference voltage for determining a fault and a comparator 332 supplied with the reference voltage from the reference voltage source 331 and an output voltage of the rectifier 320 and comparing the voltages to each other. More specifically, the fault determination circuit 330 determines whether the connector 400 connecting the power supply 100 with the controller 200 malfunctions, according to a value output from the comparator 332. Hereinbelow, a determination by the fault determination circuit 330 of a fault of the connector 400 will be described in detail with reference to FIGS. 4 to 6.

As shown in FIG. 4, a magnitude of an output voltage (Vout-offset1 or Vout-offset2) output from an output terminal of the rectifier 320 by the reference voltage source 331 may be different depending on a state of the connector 400, which can be a normal or an abnormal state. In detail, when the connector 400 is in a normal state, a voltage of Vout-offset1 may be output from the output terminal of the rectifier 320 by the reference voltage source 331 as shown in a left part of FIG. 4. At this point, when the connector 400 is in a normal state, a magnitude of a final voltage output from the output terminal of the rectifier 320 may be a sum of an output voltage value provided from the power supply 100 and Vout-offset1 value provided from the reference voltage source 331.

On the other hand, when the connector 400 malfunctions due to disconnection, contact failure, or the like, the magnitude of the voltage output from the output terminal of the rectifier 320 by the reference voltage source 331 may be Vout-offset2 as shown in a right part of FIG. 4. That is, when the connector 400 malfunctions, the connector 400 is disconnected from the power supply 100 such that the connector 400 is not supplied with the voltage of the power supply 100. Therefore, a magnitude of the final voltage output from the output terminal of the rectifier 320 may be Vout-offset2 when the connector 400 malfunctions.

As shown in FIG. 5, the magnitude of the reference voltage supplied to the comparator 332 from the reference voltage source 331 may be determined in a range between the magnitude of the voltage Vout-offset1 output from the output terminal of the rectifier 320 by the reference voltage source 331 when the connector 400 is in a normal state and the magnitude of the voltage output from the output terminal of the rectifier 320 by the reference voltage source 331 when the connector 400 is in an abnormal state. That is, as described above, the magnitude of the voltage Vout-offset2, which is output from the output terminal of the rectifier 320 by the reference voltage source 331 when the connector 400 is in an abnormal state, may be larger than the magnitude of the voltage Vout-offset1, which is output from the output terminal of the rectifier 320 by the reference voltage source 331 when the connector 400 is in a normal state. That is, the magnitude of the reference voltage supplied to the comparator 332 from the reference voltage source 331 may be determined between the Vout-offset1 and the Vout-offset2.

The fault determination circuit 330 determines whether the connector 400 connecting the power supply 100 with the controller 200 malfunctions, according to an output value of the comparator 332. When the output value of the comparator 332 converges to a predetermined value, it is possible to determine that the connector 400 malfunctions. On the other hand, the output value of the comparator 332 pulsates without converging to a predetermined value, it is possible to determine that the connector 400 is in a normal state. In other words, when the connector 400 is in a normal state, the output value of the comparator 332 pulsates as shown in a left part of FIG. 6. When the connector 400 malfunctions due to disconnection, contact failure, or the like, the output value of the comparator 332 converges to a predetermined value as shown in a right part of FIG. 6. That is, the fault determination circuit 330 determines that the connector 400 malfunctions when the output value of the comparator 332 converges to a predetermined value, and determines that the connector 400 is in a normal state when the output value of the comparator 332 pulsates.

As described above, according to the present disclosure, the fault diagnosis circuit included in the power converter can quickly diagnose whether the power converter malfunctions due to disconnection, contact failure, or the like in the power converter. Therefore, it is possible to prevent overcharge and over-discharge occurring due to abnormal control of the power converter when the power converter malfunctions due to disconnection, contact failure, or the like in the power converter. Consequently, it is possible to improve durability of a vehicle battery by preventing overcharge and over-discharge of the battery.

What is claimed is:

1. A fault diagnosis system of a power converter for an electric vehicle, the system comprising:
    a power supply supplied with power and converting the supplied power to provide the power to at least one of a motor, a battery, or an electronic device of a vehicle;
    a controller connected to the power supply by a connector and controlling charging and discharging of the battery, and operations of the motor and the electronic device of the vehicle by using the power provided from the power supply; and
    a fault diagnosis circuit connected between the power supply and the controller and diagnosing whether the connector, which connects the power supply with the controller, malfunctions,
    wherein the fault diagnosis circuit includes:
        a current transformer connected to the power supply and converting a current supplied from the power supply;
        a rectifier rectifying a current supplied from the current transformer; and
        a fault determination circuit connected to the rectifier by the connector and connected to the controller, and determining whether the connector, which connects the power supply with the controller, malfunctions,
    wherein the fault determination circuit includes:
        a reference voltage source supplying a reference voltage for determining a fault; and
        a comparator supplied with the reference voltage from the reference voltage source and an output voltage of the rectifier and comparing the voltages to each other,
    wherein the fault determination circuit determines whether the connector, which connects the power supply with the controller, malfunctions, according to an output value of the comparator, and
    wherein a magnitude of the reference voltage is determined in a range between a magnitude of a voltage output from an output terminal of the rectifier by the reference voltage source when the connector which connects the power supply with the controller is in a normal state and a magnitude of a voltage output from the output terminal of the rectifier by the reference voltage source when the connector which connects the power supply with the controller is in an abnormal state.

2. The system of claim 1, wherein the fault determination circuit determines that the connector malfunctions when the output value of the comparator converges to a predetermined value.

3. The system of claim 1, wherein the fault determination circuit determines that the connector is in a normal state when the output value of the comparator pulsates without converging to a predetermined value.

4. The system of claim 1, wherein the rectifier includes a plurality of diodes and a plurality of resistors.

* * * * *